US007006361B2

(12) United States Patent
Hosokawa et al.

(10) Patent No.: US 7,006,361 B2
(45) Date of Patent: Feb. 28, 2006

(54) ELECTROMAGNETIC WAVE SHIELDING MEMBER AND RECORDING APPARATUS INCORPORATING THE SAME

(75) Inventors: Tatsuya Hosokawa, Nagano (JP); Toru Fukushima, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 57 days.

(21) Appl. No.: 10/400,064

(22) Filed: Mar. 27, 2003

(65) Prior Publication Data

US 2003/0223212 A1 Dec. 4, 2003

(30) Foreign Application Priority Data

Mar. 28, 2002 (JP) .......................... P2002-092802

(51) Int. Cl.
*H05K 9/00* (2006.01)

(52) U.S. Cl. ...................... 361/818; 361/816; 361/792; 361/760

(58) Field of Classification Search ................ 361/818, 361/816, 800, 752, 797, 760, 748, 720, 794, 361/696, 704, 712; 174/35 GC
See application file for complete search history.

(56) References Cited

U.S. PATENT DOCUMENTS

| | | | | |
|---|---|---|---|---|
| 5,831,656 A * | 11/1998 | Chosa | ........................ | 347/108 |
| 5,930,115 A | 7/1999 | Tracy et al. | | |
| 5,950,046 A * | 9/1999 | Goto | .......................... | 399/110 |
| 6,343,020 B1 * | 1/2002 | Lin et al. | .................... | 361/816 |
| 6,504,723 B1 * | 1/2003 | Fitzgerald et al. | .......... | 361/705 |

FOREIGN PATENT DOCUMENTS

| | | |
|---|---|---|
| EP | 1130953 A1 | 9/2001 |
| WO | WO 01/99483 A1 | 12/2001 |
| WO | WO 02/41679 A2 | 5/2002 |

OTHER PUBLICATIONS

Japanese Abstract No. 2001096796, dated Apr. 10, 2001.

* cited by examiner

*Primary Examiner*—Kamand Cuneo
*Assistant Examiner*—Hung S. Bui
(74) *Attorney, Agent, or Firm*—Sughrue Mion, PLLC

(57) ABSTRACT

A controller includes a circuit board on which an electronic component is mounted to control operations of a recording apparatus. An electromagnetic wave shielding member having electric conductivity and thermal conductivity covers the electronic component. The electromagnetic wave shielding member is formed with a contact portion which is brought into contact with the electronic component.

7 Claims, 7 Drawing Sheets

ELECTROMAGNETIC WAVE SHIELDING MEMBER AND RECORDING APPARATUS INCORPORATING THE SAME

BACKGROUND OF THE INVENTION

The present invention relates to an electromagnetic wave shielding member installed so as to cover electronic components to shield an electromagnetic wave. The present invention also relates to a recording apparatus such as a facsimile machine and a printer, in which a circuit board constituting a control section is covered with such a shielding member.

Heretofore, in order to cut an electromagnetic wave irradiated from electronic components such as an IC, a LSI, and a transistor or an electromagnetic wave incident from the outside into the electronic components, it is performed that a circuit board is covered with an electromagnetic wave shielding member.

As one of the recording apparatus, there is a printer, which comprises a carriage including a recording head for performing printing on print paper, and provided so that it can reciprocate in a main scanning direction; a carriage guide shaft which guides the carriage in the main scanning direction; and a frame member which forms a plane parallel with the carriage guide shaft and forms a base body of the printer. In such the printer, a circuit board constituting a control section is arranged along a horizontal face located at the bottom of the apparatus, or arranged along the frame member. Therefore, it is important to reduce the space around the circuit board.

Therefore, in such a printer, it is not easy to cover the electronic components with the electromagnetic wave shielding member and further to install a heat release fin or a cooling fan with the electronic components in order to release heat generated from the electronic components to the outside. In result, there is a problem that free arrangement of the circuit board is difficult.

SUMMARY OF THE INVENTION

It is therefore an object of the invention to provide a heat releaser for electronic components which can reduce space around a circuit board.

In order to achieve the above object, according to the invention, there is provided an electromagnetic wave shielding member, which covers an electronic component, comprising a plate-shaped member having electric conductivity and thermal conductivity, formed with a contact portion which is brought into contact with the electronic component.

In such a configuration, since the electromagnetic wave shielding member releases heat generated from the electronic component through the contact part. Namely, the electromagnetic wave shielding member is used also as a heat releaser, whereby it is not necessary to provide a heat release fin or the like individually, the space for attaching the circuit board can be reduced, and free arrangement of the circuit board can be attained.

Preferably, a plurality of protrusions are formed on an exterior surface of the plate-shaped member.

In such a configuration, since surface area of the plate-shaped member is increased by the protrusions, heat release effect can be enhanced.

Preferably, the plate-shaped member is formed with a recessed portion such that an interior surface of the recessed portion serves as the contact portion.

In such a configuration, the electronic components can be brought into contact with the plate-shaped member while securing sufficient distance between the circuit board and the plate-shaped member. Further, since it is not necessary to individually provide a member having thermal conductivity between the electronic components and the plate-shaped member, cost can be reduced.

Preferably, the contact portion is located at a center portion of the plate-shaped member.

In such a configuration, heat generated from the electronic component can be released efficiently using the whole area of the plate-shaped member.

Preferably, the plate-shaped member is comprised of aluminum. In this case, weight reduction and of high heat release effect can be attained.

According to the invention, there is also provided a recording apparatus, comprising: a controller, including a circuit board on which an electronic component is mounted to control operations of the recording apparatus; and the above electromagnetic wave shielding member covering the electronic component.

Preferably, the recording apparatus further comprises: a carriage, on which a recording head operable to perform recording operation with respect to a recording medium is mounted; a guide shaft, extending in a first direction so as to form a reciprocating path of the carriage; and a frame member, extending in the first direction so as to form a base body of the recording apparatus. The controller is disposed on the frame member such that the circuit board extends in a second direction perpendicular to the first direction.

Preferably, both sides of the circuit board are covered with the electromagnetic wave shielding member.

In such a configuration, it is not necessary to take electromagnetic wave shielding performance of the frame member into consideration, so that free design of the frame member can be enhanced.

Here, it is preferable that the controller is disposed in the vicinity of an end of the reciprocating path of the carriage such that the controller is exposed to air flow generated by a reciprocating motion of the carriage.

Since the carriage has relatively large size in the recording apparatus, when such a carriage reciprocates in the first scanning direction, air flow occurs in the vicinity of the carriage. Particularly in the vicinity of the end of the reciprocating path of the carriage, which is a turn back point, the air flow is perturbed most.

Therefore, by the air flow occurring with the reciprocating motion of the carriage, the circuit board (electronic component) is cooled.

Namely, the carriage in the recording apparatus is used as a heat releaser for releasing heat generated from the circuit board (electronic component). Hereby, the heat releaser of the circuit board (electronic component) is constituted at a low cost by utilizing the present component, and a heat release effect can be further improved by supporting the present heat releaser (for example, heat release fin).

BRIEF DESCRIPTION OF THE DRAWINGS

The above objects and advantages of the present invention will become more apparent by describing in detail preferred exemplary embodiments thereof with reference to the accompanying drawings, wherein.

DETAILED DESCRIPTION OF THE PREFERRED EMBODIMENTS

Preferred embodiments of the invention will be described below with reference to the accompanying drawings.

Figure 1:
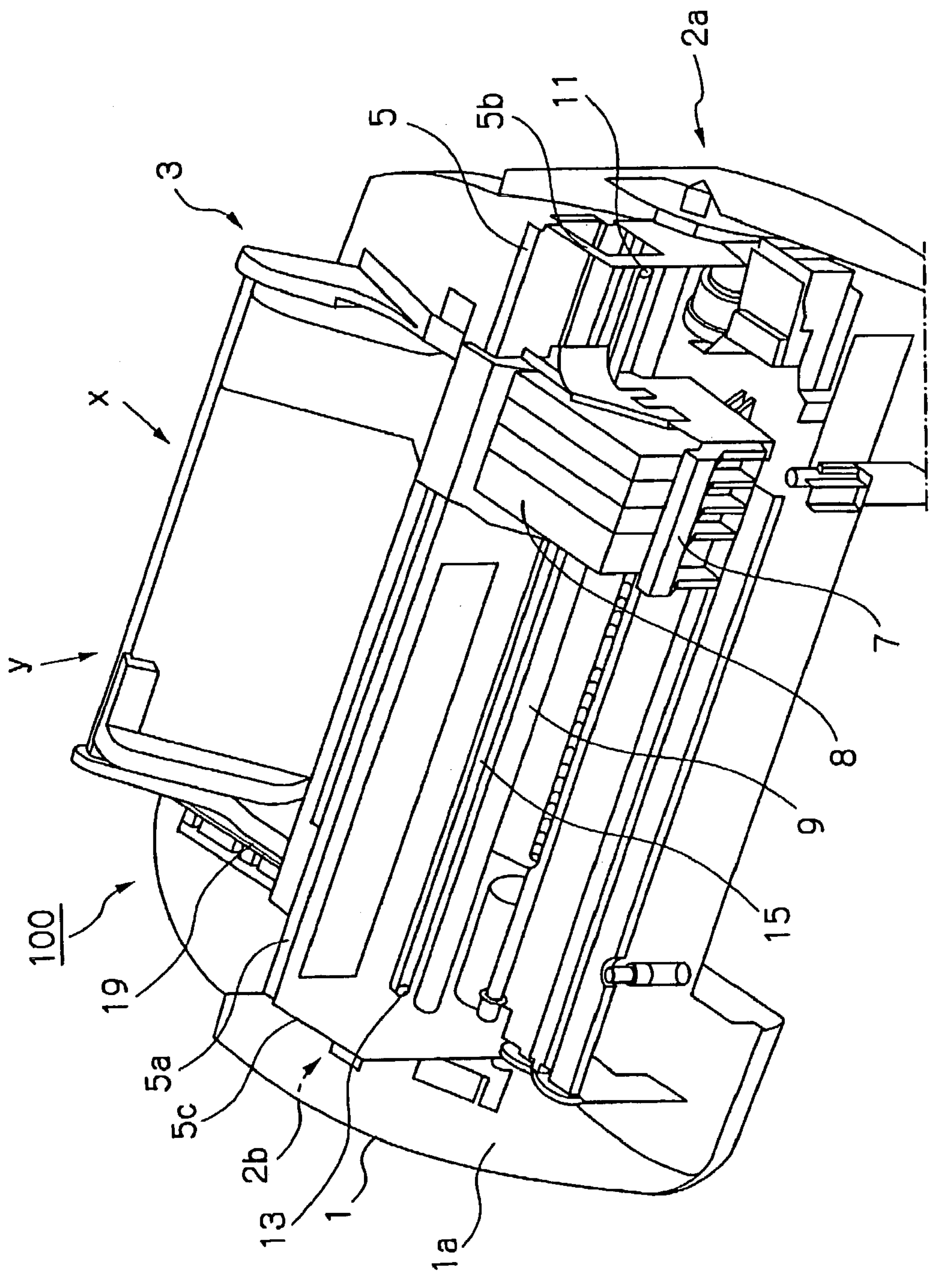
FIG. 1 is a perspective view showing an ink jet printer according to a first embodiment of the invention.

As shown in FIG. 1, an ink jet printer 100 (hereinafter, simply referred as "printer") according to a first embodiment has a lower cover member 1 covering a lower half of a printer body. Further, on the lower cover member 1, an upper cover member (not shown) is put, the printer body is covered with these two cover members to constitute the exterior appearance of the printer 100.

A base body of the printer 100 is constituted by a main frame 5. The main frame 5 comprises a center frame 5*a* extending in a main scanning direction of printing and side frames 5*b* and 5*c* located on both sides of the center frame 5*a* so as to protrude to the front side of the apparatus and to become perpendicular to the plane which the center frame 5*a* forms. On the backside of the main frame 5, a sheet feeder 3 for supplying a print sheet is provided, and on the front side of the main frame 5, a recording section (described later) which performs printing on the print sheet is provided.

Between the side frames 5*b* and 5*c*, a carriage guide shaft 9 extending in the main scanning direction is laid. On the front side of the main frame 5, a box-shaped carriage 7 including an ink cartridge 8 and a recording head (not shown) is arranged. The guide shaft 9 extends so as to penetrate the carriage 7, whereby it is guided in the main scanning direction. Further, on the both sides of the center frame 5*a*, freely rotatable driven pulley 13 and a drive pulley 11 driven by a drive motor (not shown) are set, and an endless belt 15 is laid between the drive pulley 11 and the driven pulley 13. The carriage 7 is fixed to a part of the endless belt 11, whereby it reciprocates in the main scanning direction. While the carriage 7 is reciprocating in the main scanning direction, an ink droplet supplied from the ink cartridge 8 is ejected from the recording head (not shown), whereby printing is executed.

As shown in FIG. 1, a circuit board 19 which is a part of a control unit 16 of the printer 100 is arranged on the left side of the sheet feeder 3 (on the left side viewed from the front side of the printer 100), so as to extend perpendicularly to the center frame 5*a*.

Figure 2:
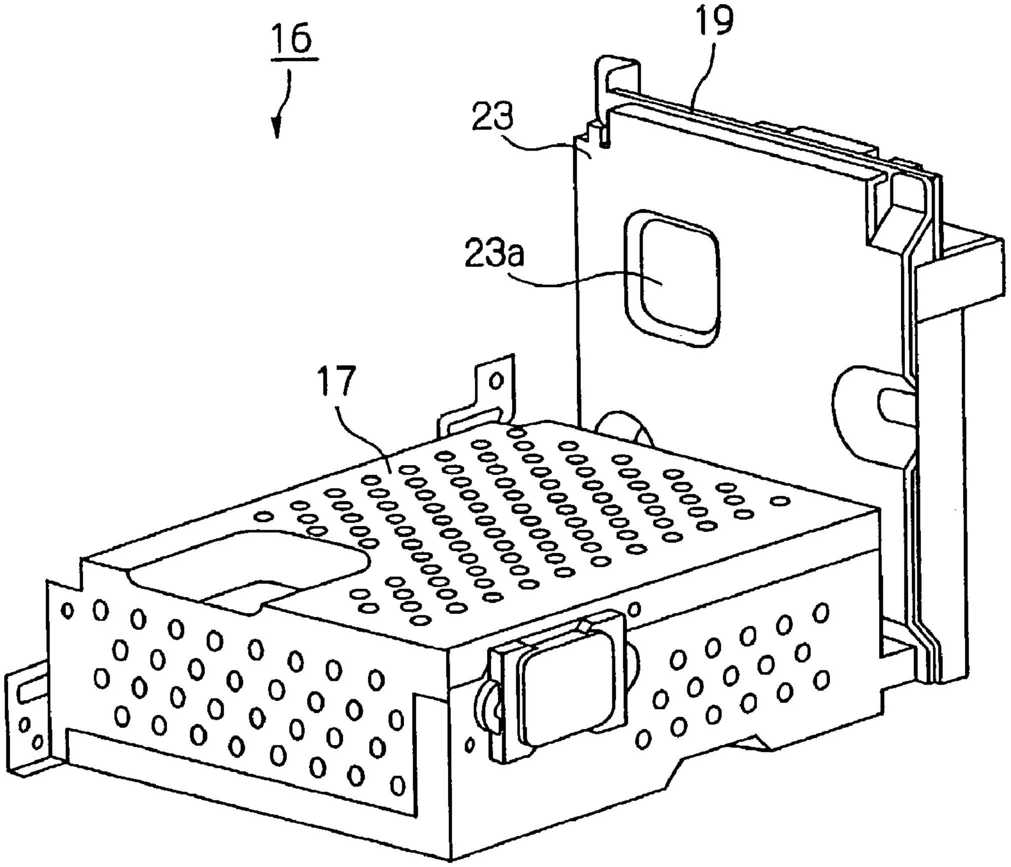
FIG. 2 is a perspective view showing a control unit in the ink jet printer, viewed from an arrow x in FIG. 1.
Figure 3:
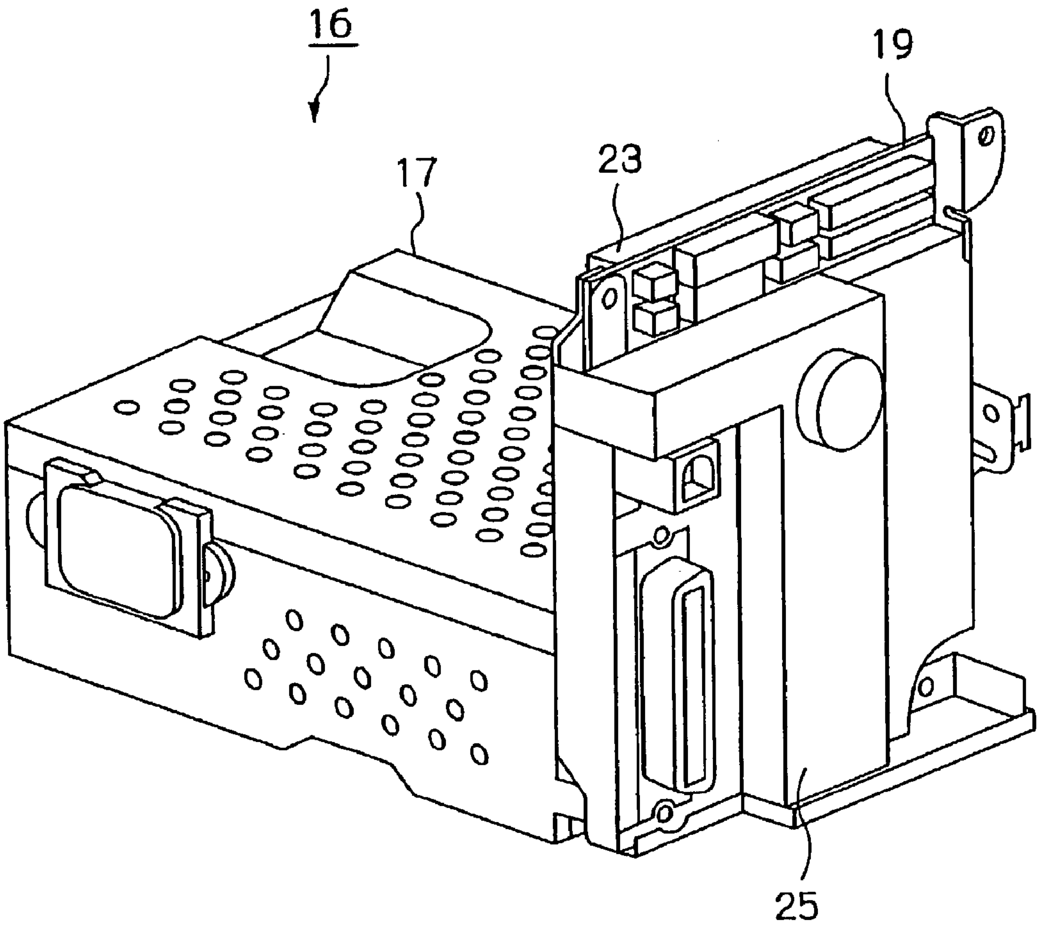
FIG. 3 is a perspective view showing the control unit in the ink jet printer, viewed from an arrow y in FIG. 1.

As shown in FIGS. 2 and 3, the control unit 16 comprises the circuit board 19 and a box-shaped power supply unit 17 arranged at the lower portion of the sheet feeder 3 to supply power to the circuit board 19.

Electronic components such as an IC, a transistor, and a CPU are mounted on the circuit board 19, and electromagnetic wave shielding members 23 and 25 are provided on both surfaces of the circuit board 19 in order to shield an electromagnetic wave radiated from the electronic components or an electromagnetic wave incident into the electronic components from the outside. These two electromagnetic wave shielding members 23 and 25 cover the whole of the circuit board 19.

Specifically, the electromagnetic wave shielding members 23 and 25 are tightly fixed onto the circuit board 19 by a screw member (not shown). These two electromagnetic wave shielding members 23 and 25 are respectively formed of a thin plate-shaped member having electric conductivity, and aluminum is used in the shielding member in this embodiment. However, any may be used as long as it has performance shielding an electromagnetic wave (electromagnetic wave shielding function).

Figure 4A:
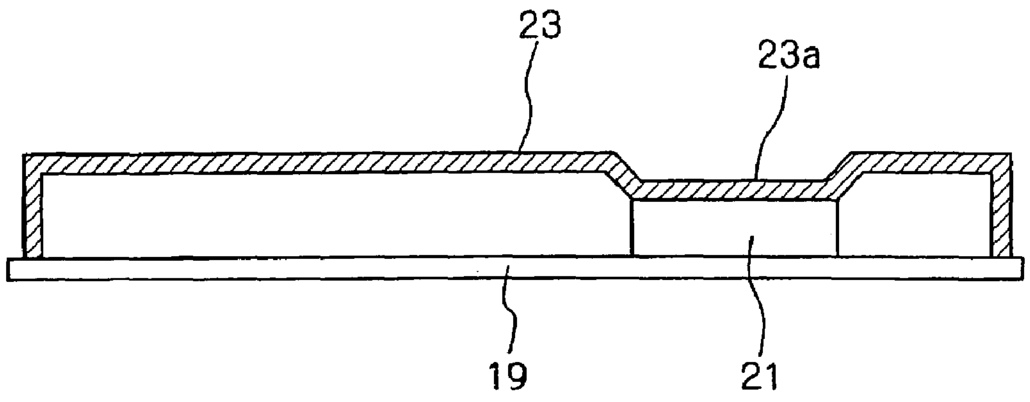
FIGS. 4A and 4B are partially sectional side views showing a circuit board and an electromagnetic wave shielding member of the control unit.

Here, in this embodiment, the electromagnetic wave shielding member 23 has a heat release function in addition to the electromagnetic wave shielding function. Namely, in the embodiment, since the electromagnetic wave shielding member 23 is formed of aluminum, it has high thermal conductivity. As shown in FIG. 4A, the electromagnetic wave shielding member 23 has a recessed part 23*a*, and if is fixed onto the circuit board 19 so that the recessed part 23*a* is brought into contact with the whole of the flat upper surface of the electronic components 21. The recessed part 23*a* is formed integrally with the electromagnetic wave shielding member 23 by deep drawing without forming any hole, whereby the recessed part 23*a* is formed at a low cost and without damaging the electromagnetic wave shielding function.

In such a configuration, heat generated from the electronic components 21 is released through the recessed part 23*a*. Namely, since the electromagnetic wave shielding member 23 is used also as a heat releaser that releases heat generated from the electronic components 21, it is not necessary to provide a heat release fin individually, whereby space for providing the circuit board 19 can be reduced and the free design can be performed.

Further, since the recessed part 23*a* formed in the electromagnetic wave shielding member 23 is brought into contact the electronic components 21, the recessed part 23*a* releases the heat generated from the electronic components 21 while providing the sufficient distance between the electromagnetic wave shielding member 23 and the circuit board 19, and without individually providing a member having thermal conductivity therebetween.

Figure 4B:
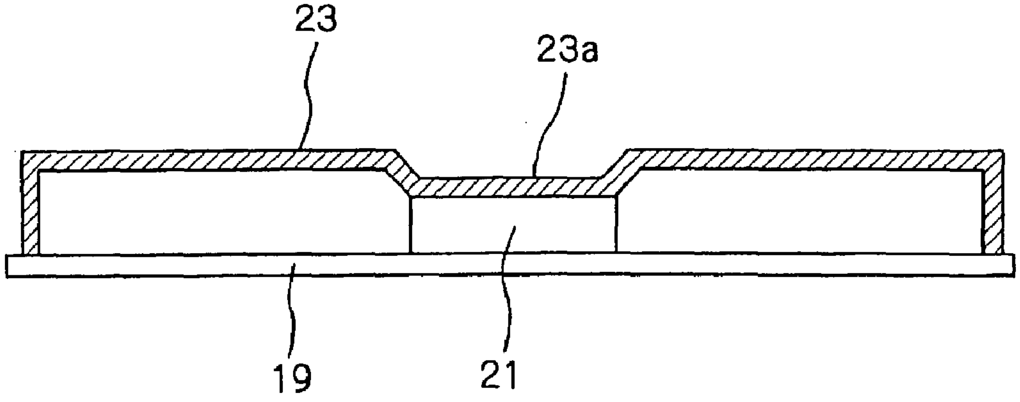

In the embodiment, as shown in FIGS. 2 and 4A, since the electronic components 21 are mounted in a position slightly shifted to a side from a center of the circuit board 19, the recessed part 23*a* is also provided in a position slightly shifted to a side from a center of the electromagnetic wave shielding member 23. However, as shown in FIG. 4B, the electronic components 21 may be mounted in the center of the circuit board 19, and the recessed part 23*a* may be accordingly provided in the center of the electromagnetic wave shielding member 23. In such a configuration, heat generated from the electronic components 21 can be released more efficiently.

Figure 5A:
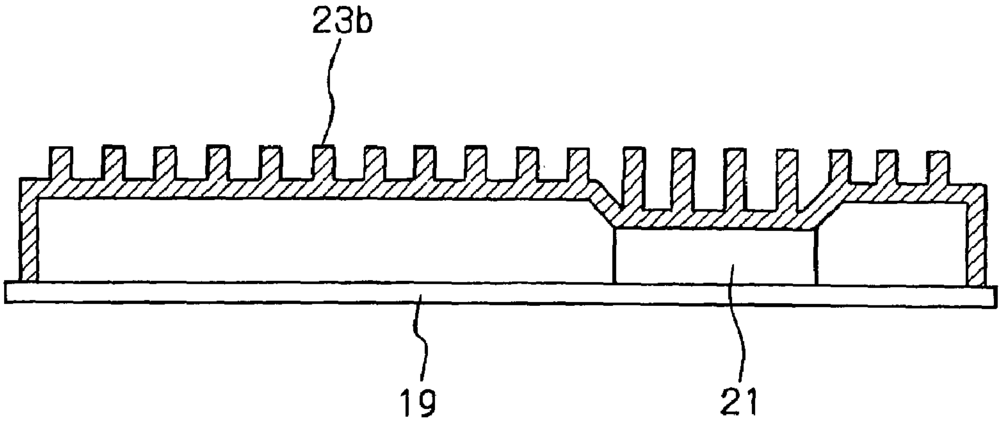
FIG. 5A is a partially sectional side view showing the control unit according to a second embodiment of the invention.

FIG. 5A shows an electromagnetic wave shielding member according to a second embodiment of the invention. In this embodiment, protrusions 23*b* are formed on a surface of the electromagnetic wave shielding member 23. In such a configuration, a surface area of the electromagnetic wave shielding member 23 increases by the protrusions 23*b*, whereby heat release ability can be enhanced.

Figure 5B:
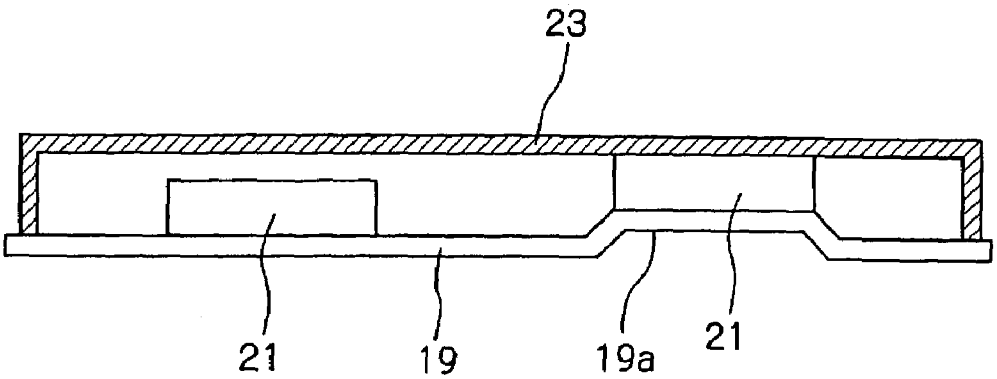
FIG. 5B is a partially sectional side view showing the control unit according to a third embodiment of the invention.

FIG. 5B shows an electromagnetic wave shielding member according to a third embodiment of the invention. In this embodiment, a setting position of the electronic components 21 in the circuit board 19 is raised such that the flat top surface of the electronic components 21 is brought into contact with the electromagnetic wave shielding member 23. By such the constitution, the electromagnetic wave shielding member 23 can be formed at a low cost, and the protrusions shown in FIG. 5A can be readily provided.

In these embodiments, though aluminum is used as a material of the electromagnetic wave shielding member 23, any material may be used as long as it has the electromagnetic wave shielding function and high thermal conductivity.

In the embodiment, the circuit board 19 is disposed so as to be perpendicular to the center frame 5*a* as described before. Therefore, compared with the constitution in which the circuit board 19 is disposed on the backside of the center frame 5*a* thereby to give the electromagnetic wave shielding function to the center frame 5*a*, the free design of the main frame 5 can be performed because it is not necessary to give the electromagnetic wave shielding function to the center frame 5*a*.

In the above embodiments, the electromagnetic wave shielding member 23 is cooled by a cooler, whereby the heat generated from the electronic components 21 is released more surely.

Figure 6:
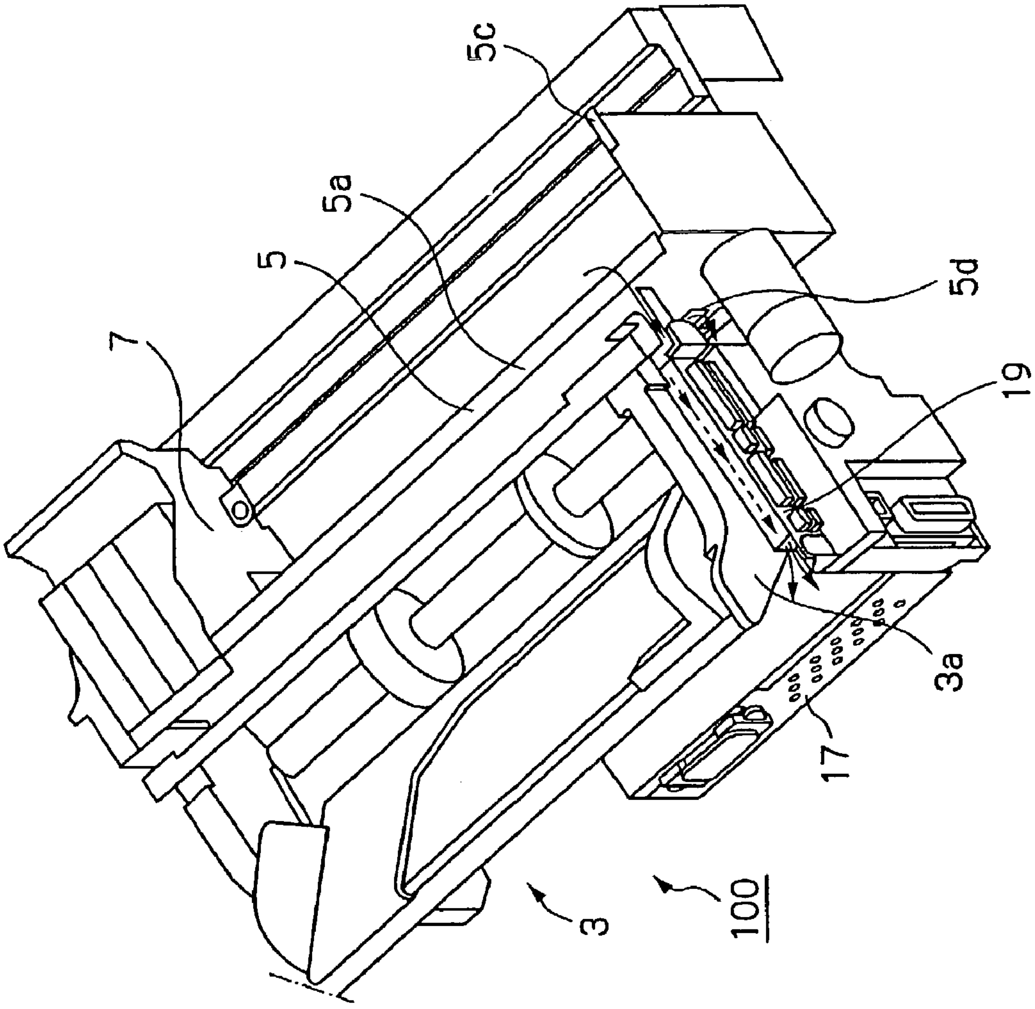
FIG. 6 is a perspective view showing a rear side of the ink jet printer.

As shown in FIG. 6, the circuit board 19 is disposed in the backside of the main frame 5 so as to extend perpendicularly to the center frame 5*a*, and placed in the vicinity of the side frame 5*c*, that is, in the vicinity of an end in a reciprocating path of the carriage 7 provided on the front side of the main frame 5.

Here, the carriage 7 has the shape of a box so as to mount the ink cartridge thereon as described before referring to FIG. 1, and its size is relatively large. Therefore, when such the carriage 7 reciprocates in the main scanning direction, air flow occurs in the vicinity of the carriage 7. More particularly in the vicinity of the end in the reciprocating path of the carriage 7, which is a turn back point of the carriage 7, the air flow is perturbed most.

Since the circuit board 19 is arranged in such the place where the air flow is perturbed, air around the circuit board 19 is also perturbed by the reciprocating motion of the carriage 7. Therefore, the heat released from the electromagnetic wave shielding member 23 (FIG. 2) provided so as to cover the circuit board 19 does not stay thereat, so that the electromagnetic wave shielding member 23 is cooled. Accordingly, the heat release effect of the electronic components 21 (FIG. 2) by the electromagnetic wave shielding member 23 can be further enhanced.

In other words, since the carriage 7 is utilized as the cooler for releasing the heat generated from the electromagnetic wave shielding member 23 (electronic components 21), use of the present component provides the cooler of the electromagnetic wave shielding member 23 (electronic components 21) at a low cost.

More specifically, a window 5*d* is formed on the center frame 5*a* at a portion close to the side frame 5*c* (where the circuit board 19 is arranged). Therefore, when the carriage 7 moves to the circuit board 19 side, air flowing through the window 5*d* to the circuit board 19 occurs together with air flow from the upper portion of the center frame 5*a* to the circuit board 19 as shown by arrows in FIG. 6. Hereby, the electromagnetic wave shielding member 23 (electronic components 21) is cooled more efficiently.

Further, the printer 100 is provided with the lower cover member 1 and the upper cover member (not shown) as described the above. Therefore, when the carriage 7 moves to the circuit board 19 side, the air flow comes into collision with an inner side wall 1*a* of the lower cover member 1 and flows also to the backside of the apparatus, that is, to the circuit board 19 side. Therefore, the cooling effect of the electromagnetic wave shielding member 23 (electronic components 21) can be further enhanced.

In addition, in the lower cover member 1, through holes (not shown) are formed at portions located on both sides of the reciprocating path of the carriage 7 (positions shown by reference numerals 2*a* and 2*b* in FIG. 1), through which air exchange between the apparatus inside and the apparatus outside can be performed, whereby the cooling effect of the electromagnetic wave shielding member 23 (electronic component 21) can be further enhanced.

When the carriage 7 moves in the direction where it approaches the circuit board 19, air is taken in from the through hole distant from the circuit board 19 (the through hole provided in the position shown by the reference numeral 2*a*), and it is exhausted from the other through hole (the through hole provided in the position shown by the reference numeral 2*b*). On the contrary, when the carriage 7 moves in the direction where it separates from the circuit board 19, air is taken in from the through hole near the circuit board 19 (the through hole provided in the position shown by the reference numeral 2*b*), and it is exhausted from the other through hole (the through hole provided in the position shown by the reference numeral 2*a*).

Therefore, in consideration with airflow with movement of the carriage 7, the through holes are thus provided on the both sides of the reciprocating path of the carriage 7, whereby their through holes have two functions of an intake port and an exhaust port. Therefore, the cooling effect of the electromagnetic wave shielding member 23 (electronic components 21) can be further enhanced.

Furthermore, as shown in FIG. 6, the electromagnetic wave shielding member 23 having the function of the heat releaser for the electronic components 21 is arranged in a position opposed to a side wall 3*a* of the sheet feeder 3 and in a position where narrow space is formed between the side wall 3*a* and the shielding member 23. Therefore, speed of air flowing between the sidewall 3*a* and the electromagnetic wave shielding member 23 becomes large. Namely, the accelerated air flow further enhances the cooling effect of the electromagnetic wave shielding member 23 (electronic components 21).

Figure 7:
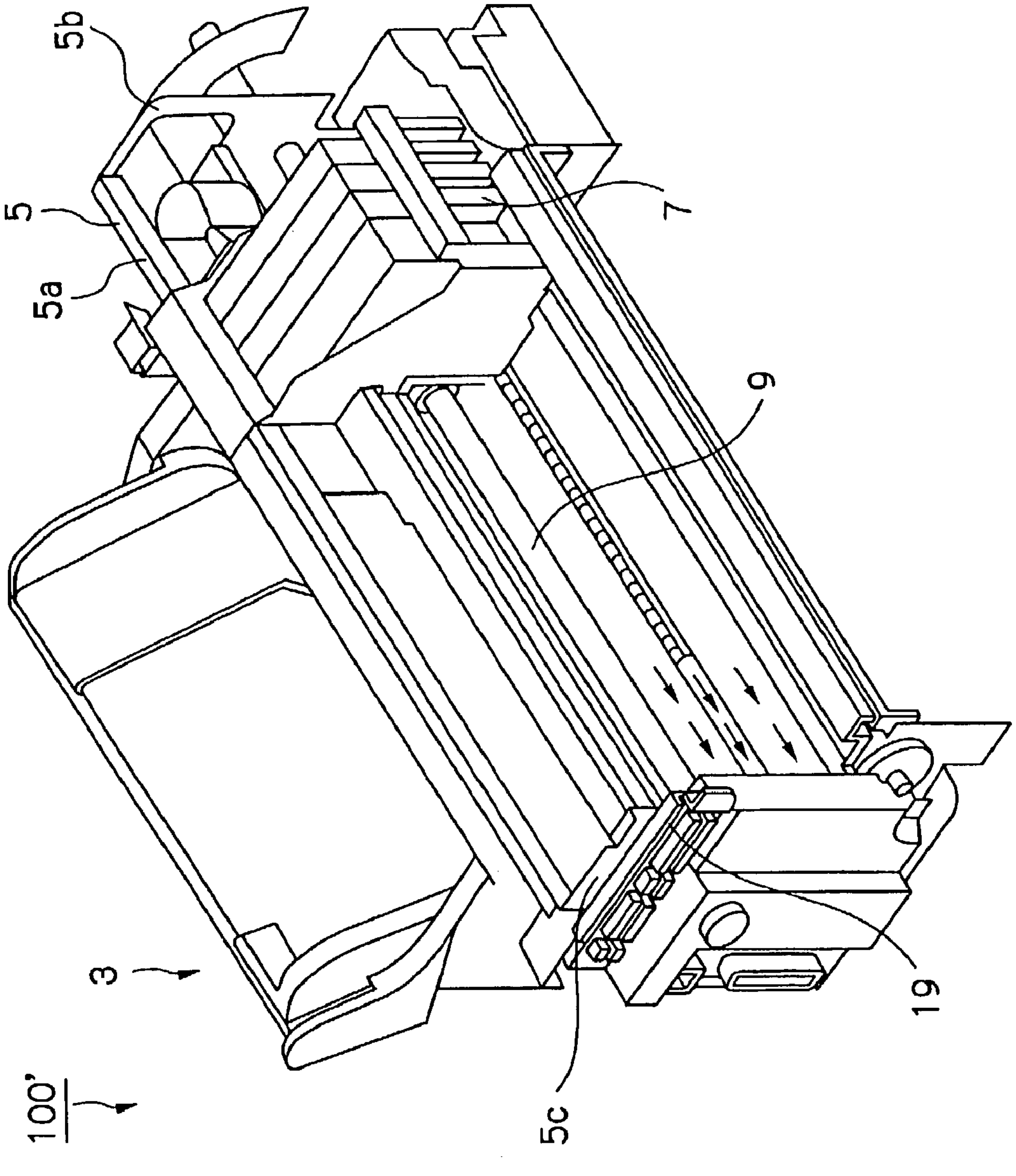
FIG. 7 is a perspective view showing an ink jet printer according to a fourth embodiment of the invention.

FIG. 7 shows an ink jet printer according to a fourth embodiment. In this embodiment, the circuit board 19 is disposed adjacent to the side frame 5*c*, so that the cooling effect of the electromagnetic wave shielding member 23 (electronic components 21) with the reciprocating motion of the carriage 7 can be further enhanced. Therefore, the air flow with the reciprocating motion of the carriage 7 directly comes into collision with the electromagnetic wave shielding member 23, whereby the electromagnetic wave shielding member 23 (electronic components 21) can be cooled more effectively.

The carriage 7 reciprocates in the main scanning direction usually with the printing operation. However, in the printer 100 according to the embodiment, there is provided a temperature detector (heat sensor: not shown) which detects temperature inside the cover member. When the control section in the printer 100 detects that the temperature inside the cover member is over the fixed value, it reciprocates the carriage 7 regardless of presence of print data. Therefore, even in case that there is no print data, air exchange between the cover member inside and the cover member outside is promoted, whereby it is possible to prevent the temperature of the electromagnetic wave shielding member 23 (electronic components 21) from excessively rising.

What is claimed is:

1. A recording apparatus, comprising:

a controller, including a circuit board on which an electronic component is mounted to control operations of the recording apparatus;

an electromagnetic wave shielding member, which covers the electronic component, comprising a plate-shaped member having electric conductivity and thermal conductivity, formed with a contact portion which is brought into contact with the electronic component;

a carriage, on which a recording head operable to perform recording operation with respect to a recording medium is mounted;

a guide shaft, extending in a first direction so as to form a reciprocating path of the carriage; and a frame member, extending in the first direction so as to form a base body of the recording apparatus, wherein the controller is disposed on the frame member such that the circuit board extends in a second direction perpendicular to the first direction.

2. The recording apparatus as set forth in claim 1, wherein a plurality of protrusions are formed on an exterior surface of the plate-shaped member.

3. The recording apparatus as set forth in claim 1, wherein the plate-shaped member is formed with a recessed portion such that an interior surface of the recessed portion serves as the contact portion.

4. The recording apparatus as set forth in claim 1, wherein the contact portion is located at a center portion of the plate-shaped member.

5. The recording apparatus as set forth in claim 1, wherein the plate-shaped member is comprised of aluminum.

6. The recording apparatus as set forth in claim 1, wherein the controller is disposed in the vicinity of an end of the reciprocating path of the carriage such that the controller is exposed to air flow generated by a reciprocating motion of the carriage.

7. The recording apparatus as set forth in claim 1, wherein both sides of the circuit board are covered with the electromagnetic wave shielding member.

* * * * *